United States Patent
Shim (10) Patent No.: US 6,639,867 B2
(45) Date of Patent: Oct. 28, 2003

(54) DECODER CIRCUIT IN A SEMICONDUCTOR MEMORY DEVICE

(75) Inventor: Young Bo Shim, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/105,196

(22) Filed: Mar. 26, 2002

(65) Prior Publication Data

US 2003/0002380 A1 Jan. 2, 2003

(30) Foreign Application Priority Data

Jun. 28, 2001 (KR) .................................. 10-2001-37485

(51) Int. Cl.[7] .................................................. G11C 8/00
(52) U.S. Cl. ............................ 365/230.06; 365/230.08; 365/233; 365/185.23; 365/189.05
(58) Field of Search ....................... 365/230.06, 230.08, 365/233, 185.23, 189.05

(56) References Cited

U.S. PATENT DOCUMENTS

| | | | | |
|---|---|---|---|---|
| 5,107,465 A | * | 4/1992 | Fung et al. | ............ 365/230.08 |
| 5,295,115 A | * | 3/1994 | Furuya et al. | ......... 365/230.06 |
| 6,333,892 B2 | * | 12/2001 | Hamamoto et al. | .... 365/230.08 |
| 6,370,058 B1 | * | 4/2002 | Fukumoto | ............. 365/185.08 |

\* cited by examiner

*Primary Examiner*—David Nelms
*Assistant Examiner*—Connie C. Yoha
(74) *Attorney, Agent, or Firm*—Jacobson Holman PLLC (57) ABSTRACT

A decoder circuit in a semiconductor memory device for improving the productivity of a semiconductor memory device by reducing the area occupied by a decoder. In order to accomplish this, a decoder circuit in a semiconductor memory device comprises a decoder control unit for receiving an external clock signal and a reset signal to generate a clear signal, an internal reset signal, a plurality of driver enable signals and a plurality of shift register enable signals; and a plurality of decoders for decoding the clear signal, the internal reset signal, the plurality of driver enable signals and the plurality of shift register enable signals to generate a plurality of wordline-driving signals.

22 Claims, 7 Drawing Sheets

DECODER CIRCUIT IN A SEMICONDUCTOR MEMORY DEVICE

BACKGROUND OF THE INVENTION

1. Field of the Invention

The invention relates generally to a decoder circuit in a semiconductor memory device, and more particularly to, a decoder circuit capable of reducing its occupation area.

2. Description of the Prior Art

Generally, a semiconductor memory device includes a row decoder and a column decoder. These decoders decode addresses from an address buffer before they are sent to a memory cell.

Figure 1:
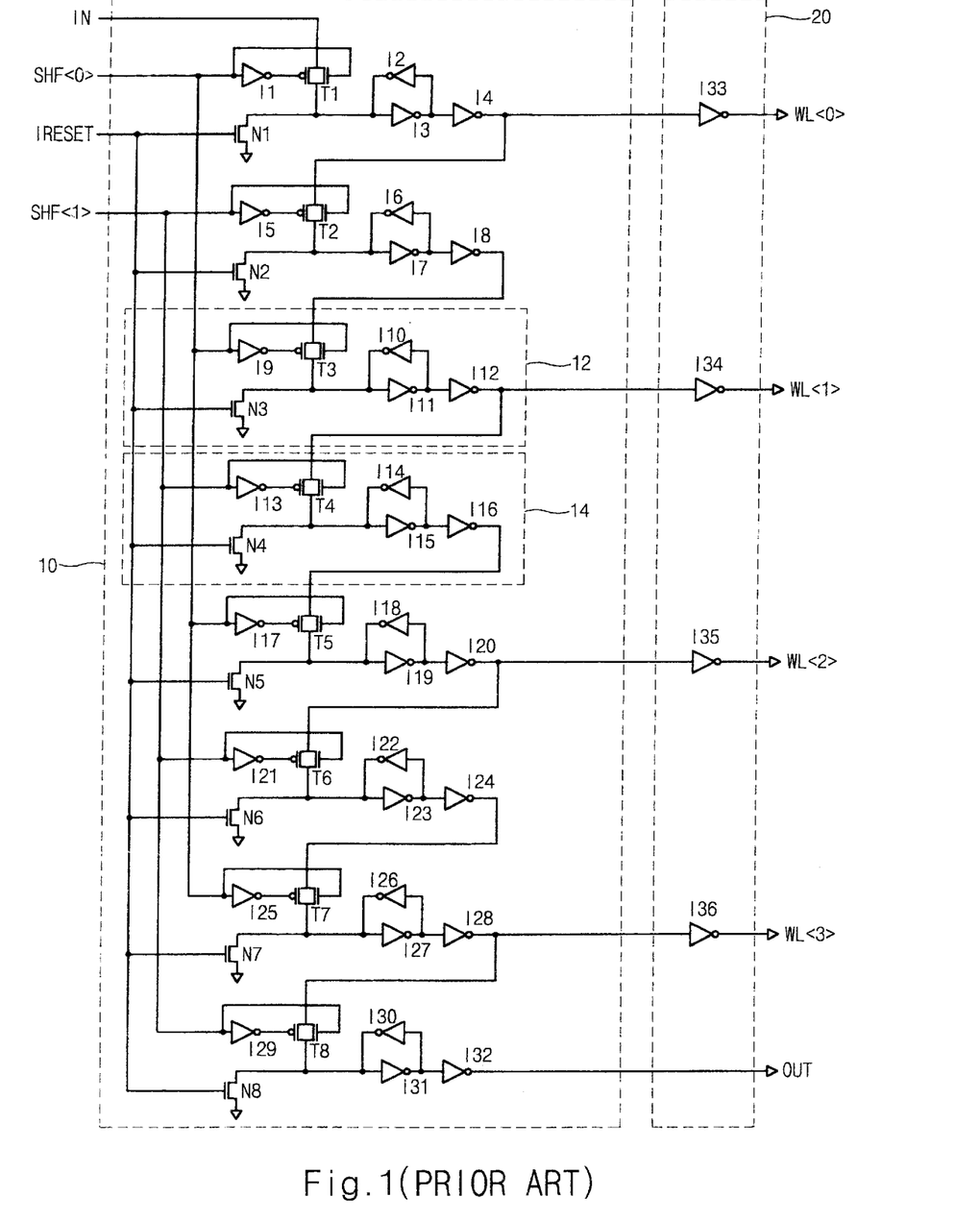
FIG. 1 is a circuit diagram of a conventional decoder circuit in a semiconductor memory device.

FIG. 1 is a circuit diagram of a conventional decoder circuit in a semiconductor memory device. The decoder circuit includes a shift register 10 and a driver 20.

The shift register 10 consists of a latch circuit 12 for maintaining the output signal of the driver 20 for a given period of time and a latch circuit 14 for relaying the signal to a shift register at a next stage and maintaining it. The driver 20 is connected to the two latch circuits 12 and 14.

Therefore, large occupation area is needed and the die size is thus increased since these latch circuits 12 and 14 are repeatedly positioned at respective drivers 20. Thus, productivity is degraded due to increased die size.

SUMMARY OF THE INVENTION

In order to solve these problems, an object of the present invention is to improve the productivity of semiconductor memory devices by reducing the area occupied by a decoder.

In order to accomplish the above object, a decoder circuit in a semiconductor memory device according to the first aspect of the present invention comprises a plurality of decoder; and a decoder control means for controlling the plurality of decoders in response to an external clock signal and a reset signal, wherein the plurality of decoder drive a plurality of wordlines in response to the output signals of the decoder control means.

A decoder circuit in a semiconductor memory device according to a second aspect of the present invention comprises a decoder control means, a plurality of shift registers and a plurality of drivers. The decoder control means generates an internal reset signal, a plurality of driver enable signals and a plurality of shift register enable signals in response to an external clock signal and a reset signal. The plurality of shift registers generates a plurality of latch signals in response to the internal reset signal and the plurality of shift register enable signals. The plurality of drivers drives a plurality of wordlines in response to the plurality of latch signals and the plurality of driver enable signals, wherein the plurality of shift registers has a loop structure in which an output signal of the shift register at the last stage of the plurality of shift registers is inputted to an input terminal of the shift register at the first stage of the plurality of shift registers.

BRIEF DESCRIPTION OF THE DRAWINGS

The aforementioned aspects and other features of the present invention will be explained in the following description with reference to the accompanying drawings, wherein.

DETAILED DESCRIPTION OF PREFERRED EMBODIMENTS

The present invention will be described in detail by way of a preferred embodiment with reference to accompanying drawings.

Figure 2:
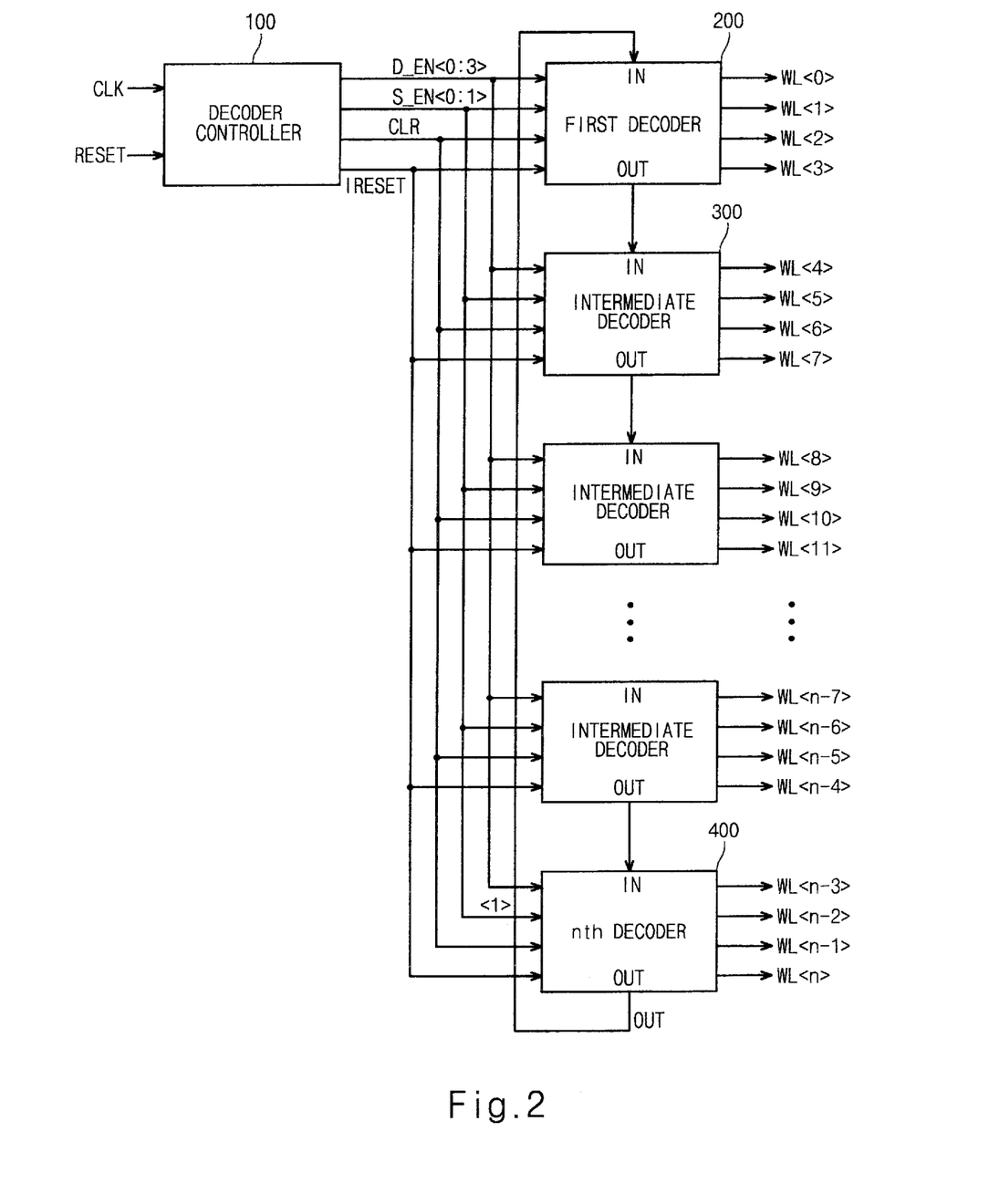
FIG. 2 is a block diagram of a decoder circuit in a semiconductor memory device according to a preferred embodiment of the present invention.

FIG. 2 is a block diagram of a decoder circuit in a semiconductor memory device according to a preferred embodiment of the present invention. The decoder circuit includes a decoder control unit 100, a first decoder 200, a plurality of intermediate decoders 300 and an $n^{th}$ decoder 400.

The decoder control unit 100 receives an external clock signal CLK and a reset signal RESET to generate a clear signal CLR, an internal reset signal IRESET, a plurality of driver enable signals D_EN<0:3>, and a plurality of shift register enable signals S_EN<0:1>.

The first decoder 200 receives the clear signal CLR, the internal reset signal IRESET, the plurality of driver enable signals D_EN<0:3>, the plurality of shift register enable signals S_EN<0:1>, and an output signal from an output terminal OUT of the $n^{th}$ decoder 400 to generate a plurality of wordline-driving signals WL<0:3>.

The intermediate decoder 300 receives the clear signal CLR, the internal reset signal IRESET, the plurality of driver enable signals D_EN<0:3>, the plurality of shift register enable signals S_EN<0:1>, and an output signal from an output terminal OUT of the first decoder 200 to generate a plurality of wordline-driving signals WL<4:7>~WL<n-7:n-4>.

The $n^{th}$ decoder 400 receives the clear signal CLR, the internal reset signal RESET, the plurality of driver enable signals D_EN<0:3>, the shift register enable signal S_EN<1>, and an output signal from an output terminal OUT of an intermediate decoder 300 to generate a plurality of wordline-driving signals WL<n-3:n>.

These first ~$n^{th}$ decoders 200, 300 and 400 are serially connected and the output terminal OUT of the $n^{th}$ decoder 400 is connected to the input terminal IN of the first decoder 200.

The structure and operation of each of the components 100, 200, 300 and 400 in FIG. 2 will now be described in detail.

Figure 3:
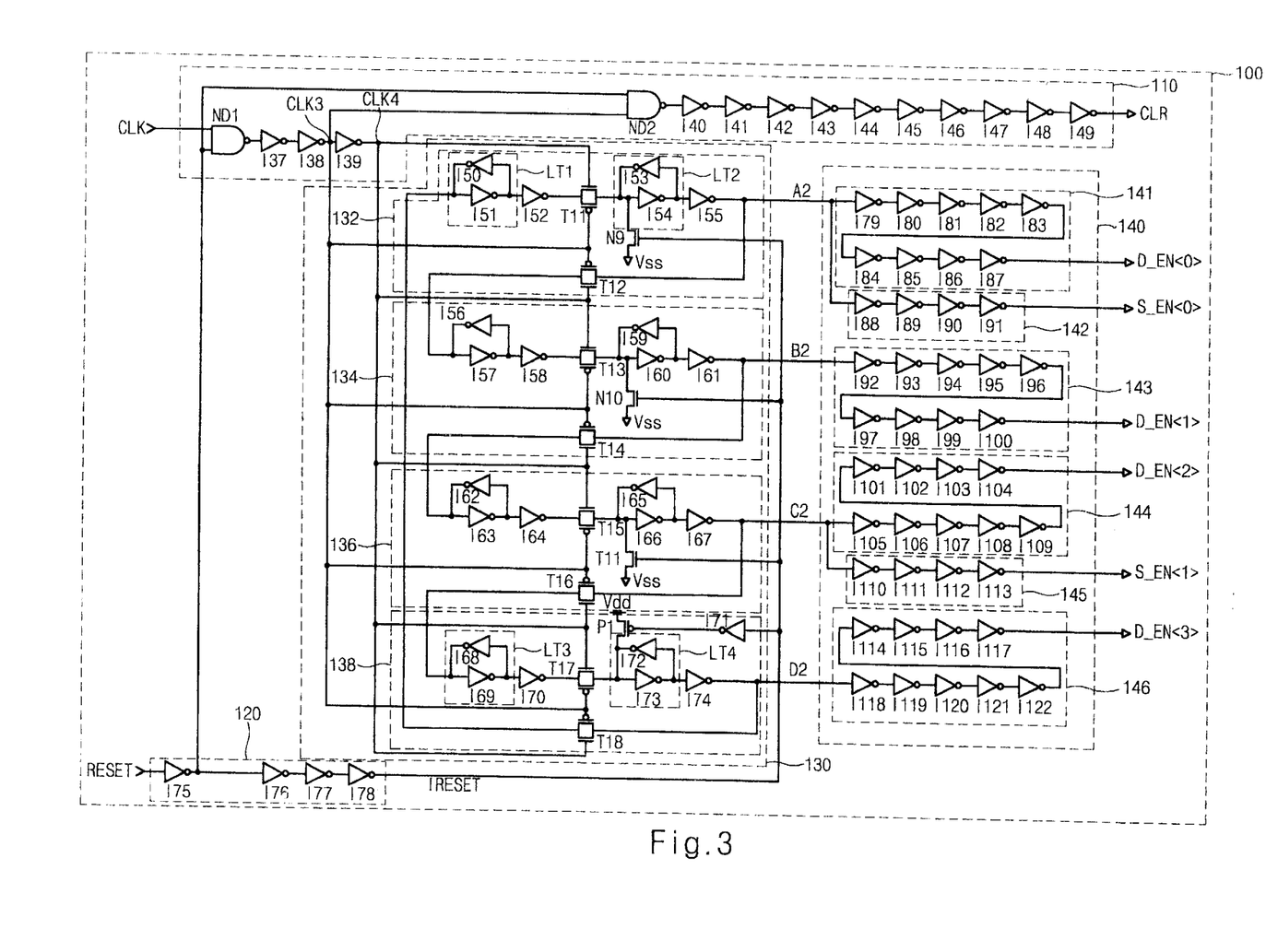
FIG. 3 is a circuit diagram of the decoder control unit in FIG. 2.

FIG. 3 is a circuit diagram of the decoder control unit 100. The decoder control unit 100 includes a clear signal generator 110, an internal reset signal generator 120, a latch circuit 130 and a shift register/driver enable signal generator 140.

The clear signal generator 110 receives an external clock signal CLK to generate internal clock signals CLK3 and CLK4, and a clear signal CLR. The internal reset signal generator 120 receives a reset signal RESET to generate an internal reset signal IRESET. The latch circuit 130 receives the internal clock signals CLK3 and CLK4 to generate latch signals A2, B2, C2 and D2. The shift register/driver enable signal generator 140 receives the latch signals A2, B2, C2 and D2 to generate driver enable signals D_EN<0:3> and shift register enable signals S_DEN<0:2>.

In the clear signal generator 110, a NAND gate ND1 logically combines the external clock signal CLK and an inverted signal of the reset signal RESET. Inverters 137 and 138 sequentially invert the output signal of the NAND gate ND1 to generate the internal clock signal CLK3. An inverter I39 inverts the output signal of the inverter I38 to generate the internal clock signal CLK4. A NAND gate ND2 logically combines an inverted signal of the reset signal RESET and the internal clock signal CLK3. Inverters I40–I49 sequentially invert the output signal of the NAND gate ND2.

The internal reset signal generator 120 includes a plurality of inverters 175–178 for sequentially inverting the reset signal RESET to generate the internal reset signal IRESET.

The latch circuit 130 includes latch circuits 132, 134, 136 and 138 for receiving the internal clock signals CLK3 and CLK4 and the internal reset signal IRESET to generate the latch signals A2, B2, C2 and D2.

In the latch circuit 132, an inverter latch LT1 latches the output signal of the latch circuit 138. An inverter I52 inverts the output signal of the inverter latch LT1. A transfer gate T11 transfers the output signal of an inverter I52 under the control of the internal clock signals CLK3 and CLK4. An inverter latch LT2 latches the output signal of the transfer gate T11. An inverter I55 inverts the output signal of the inverter latch LT2. A NMOS transistor N9 has its source and drain connected to the ground voltage Vss and the latch circuit LT2, respectively, and a gate for receiving the internal reset signal IRESET. The transfer gate T12 transfers the output signal of the latch circuit 132 under the control of the internal clock signals CLK3 and CLK4.

The latch circuits 134 and 136 have the same structures as that of the latch circuit 132, except that the latch circuit 13 receives the output signal of the latch circuit 132 and the latch circuit 136 receives the output signal of the latch circuit 134.

In the latch circuit 138, an inverter latch LT3 latches the output signal of the latch circuit 136. An inverter I70 inverts the output signal of the inverter latch LT3. A transfer gate T17 transfers the output signal of the inverter I70 under the control of the internal clock signals CLK3 and CLK4. An inverter latch LT4 latches the output signal of the transfer gate T17. The inverter I74 inverts the output signal of the inverter latch LT4. An inverter I71 inverts the internal reset signal IRESET. A PMOS transistor P1 has its source and drain connected to the supply voltage Vdd and the latch circuit LT4, respectively, and a gate for receiving the output signal of the inverter I71. A transfer gate T18 transfers the output signal of the latch circuit 138 to the latch circuit 132 under the control of the internal clock signals CLK3 and CLK4.

The shift register/driver enable signal generator 140 includes the first~fourth driver enable signal generators 141, 143, 144 and 146, and the first and the second shift register enable signal generators 142 and 145.

The first~fourth driver enable signal generators 141, 143, 144 and 146 receive the latch signals A2, B2, C2 and D2 from the first~fourth latch circuits 132, 134, 136 and 138 to generate driver enable signals D_EN<0:3>. The first and the second shift register enable signal generators 142 and 145 receive the latch signals A2, B2, C2 and D2 to generate shift register enable signals S_EN<0:1>.

The first driver enable signal generator 141 has inverters I79~I87 for inverting the latch signal A2 to generate the driver enable signal D_EN<0>. The second driver enable signal generator 143 has inverters I92~I100 for inverting the latch signal B2 to generate the driver enable signal D_EN<1>. The third driver enable signal generator 144 has inverters I101~I109 for inverting the latch signal C2 to generate the driver enable signal D_EN<2>. The fourth driver enable signal generator 146 has inverters I114~I122 for inverting the latch signal D2 to generate the driver enable signal D_EN<3>. The first shift register enable signal generator 142 has inverters I88~I91 for inverting the latch signal A2 to generate the shift register enable signal S_EN<0>. The second shift register enable signal generator 145 has inverters I110~I113 for inverting the latch signal C2 to generate the shift register enable signal S_EN<1>.

Figure 4:
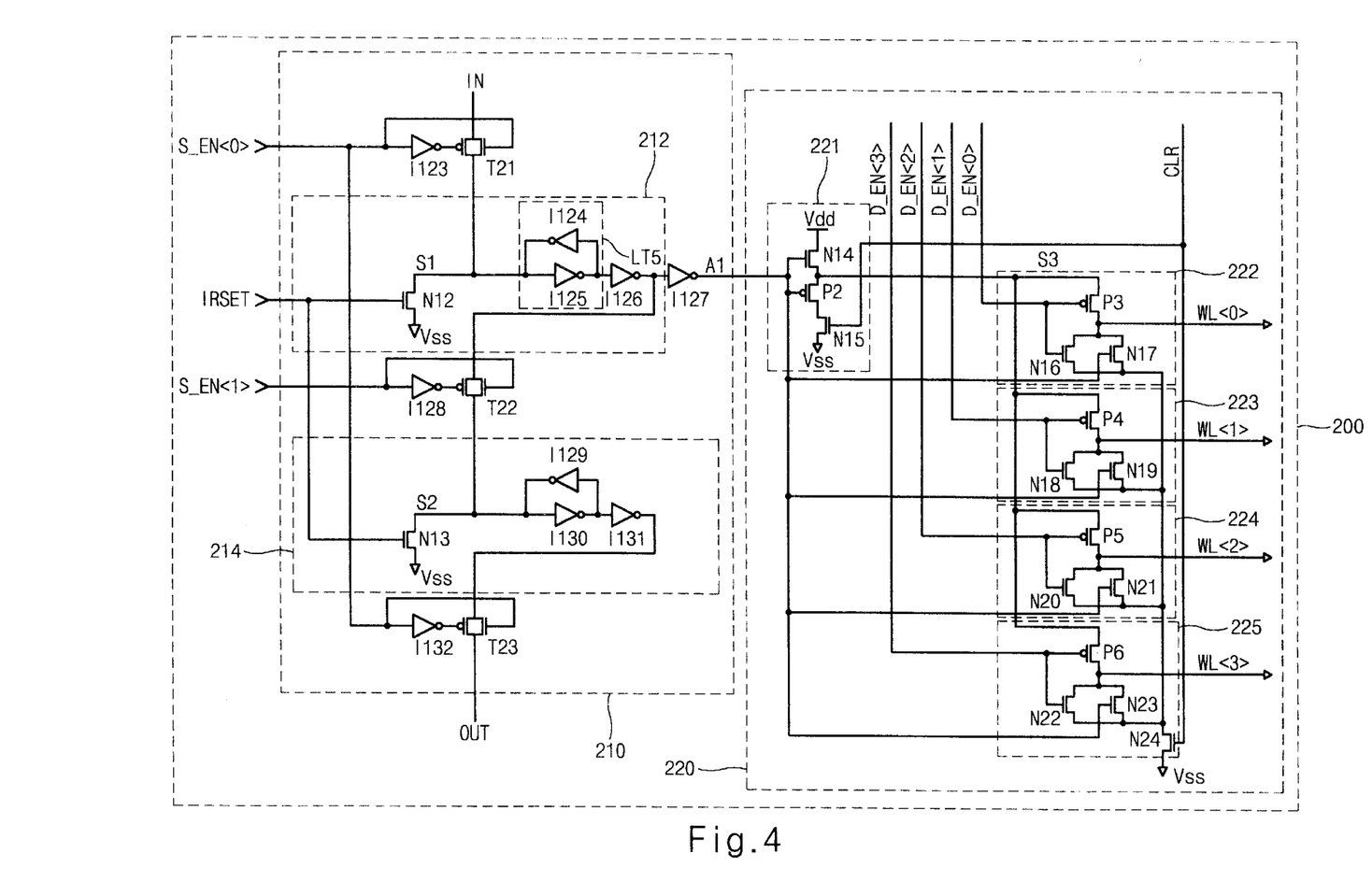
FIG. 4 is a circuit diagram of the first decoder in FIG. 2.

FIG. 4 is a circuit diagram of the first decoder 200. The first decoder 200 includes a shift register 210 and a driver 220.

The shift register 210 stores the output signal of a latch circuit 414 (described later) in the $n^{th}$ decoder 400, for a given period of time, in response to the internal reset signal IRESET and the plurality of shift register enable signals S_EN<0:1>, and it then generates a latch signal A1. The driver 220 receives the output signal of the shift register 210, the driver enable signals D_EN<0:3> and the clear signal CLR to generate wordline-driving signals WL<0:3>.

In this shift register 210, an inverter I123 inverts the shift register enable signal S_EN<0>. A transfer gate T21 transfers the output signal of the latch circuit 414 within the $n^{th}$ decoder 400 inputted to its input terminal IN under the control of the shift register enable signal S_EN<0> and an output signal the inverter I123. A latch circuit 212 latches a signal inputted to its input terminal IN via a transfer gate T21 in response to the internal reset signal IRESET. An inverter I127 inverts the output signal of the latch circuit 212 to generate a latch signal A1. An inverter I128 inverts the shift register enable signal S_EN<1>. A transfer gate T22 transfers the output signal of the latch circuit 212 under the control of the shift register enable signal S_EN<1> and the output signal of the inverter I128. A latch circuit 214 latches the output signal of the latch circuit 212 inputted via the transfer gate T22 in response to the internal reset signal IRESET. An inverter I132 inverts the shift register enable signal S_EN<0>. A transfer gate T23 transfers the output signal of the latch circuit 214 to a latch circuit at the next stage under the control of the shift register enable signal <S_EN<0> and the output signal of the inverter I132.

In the latch circuit 212, a NMOS transistor N12 has a source connected to the ground voltage Vss and a gate to which the internal reset signal IRSET is applied. An inverter latch LT5 is connected to a drain of the NMOS transistor N12. An inverter I126 inverts the output signal of the inverter latch LT5. A latch circuit 214 has the same structure as that of the latch circuit 212, except that it receives the output signal of the latch circuit 212 via the transfer gate T22.

The driver 220 includes a driving unit 221 and wordline-driving signal generators 222, 223, 224 and 225.

The driving unit 221 receives the latch signal A1 from the shift register 210 and the clear signal CLR to generate a driver-driving signal. The wordline-driving signal generator 222 receives the driver-driving signal from the driving unit 221, the driver enable signal D_EN<0> and an inverted signal of the output signal of the latch circuit 212 to generate a wordline-driving signal WL<0>. A wordline-driving signal generator 223 receives the driver-driving signal from the driving unit 221, the driver enable signal D_EN<1> and an inverted signal of the output signal of the latch circuit 212 to generate the wordline-driving signal WL<1>. A wordline-driving signal generator 224 receives the driver-driving signal from the driving unit 221, the driver enable signal D_EN<2> and an inverted signal of the output signal of the latch circuit 212 to generate a wordline-driving signals WL<2>. A wordline-driving signal generator 225 receives the driver-driving signal from the driving unit 221, the driver enable signal D_EN<3> and an inverted signal of the output signal of the latch circuit 212 to generate the wordline-driving signals WL<3>.

In this driving unit 221, NMOS and PMOS transistors N14, P2 and N15 are serially connected between the supply voltage Vdd and the ground voltage Vss. Each of gates of the NMOS and PMOS transistors N14 and P2 receives an inverted signal of the output signal of the latch circuit 212 and a NMOS transistor N1 5 receives the clear signal CLR.

In this wordline-driving signal generator 222, a PMOS transistor P3 has a drain connected to an output terminal of the driving unit 221 and a gate to which the driver enable signal D_EN<0> is applied. A NMOS transistor N16 has a source connected to a drain of the NMOS transistor N24, a drain connected to a drain of the PMOS transistor P3 and a gate to which the driver enable signal D_EN<0> is applied. A NMOS transistor N17 has a source connected to a drain of the NMOS transistor N24, a drain connected to a drain of the PMOS transistor P3 and a gate to which an inverted signal of the output signal of the latch circuit 212 is applied.

The wordline-driving signal generators 223, 224 and 225 have the same construction to the wordline-driving signal generator 222, except that they receive the driver enable signal D_EN<1:3>, respectively.

Figure 5:
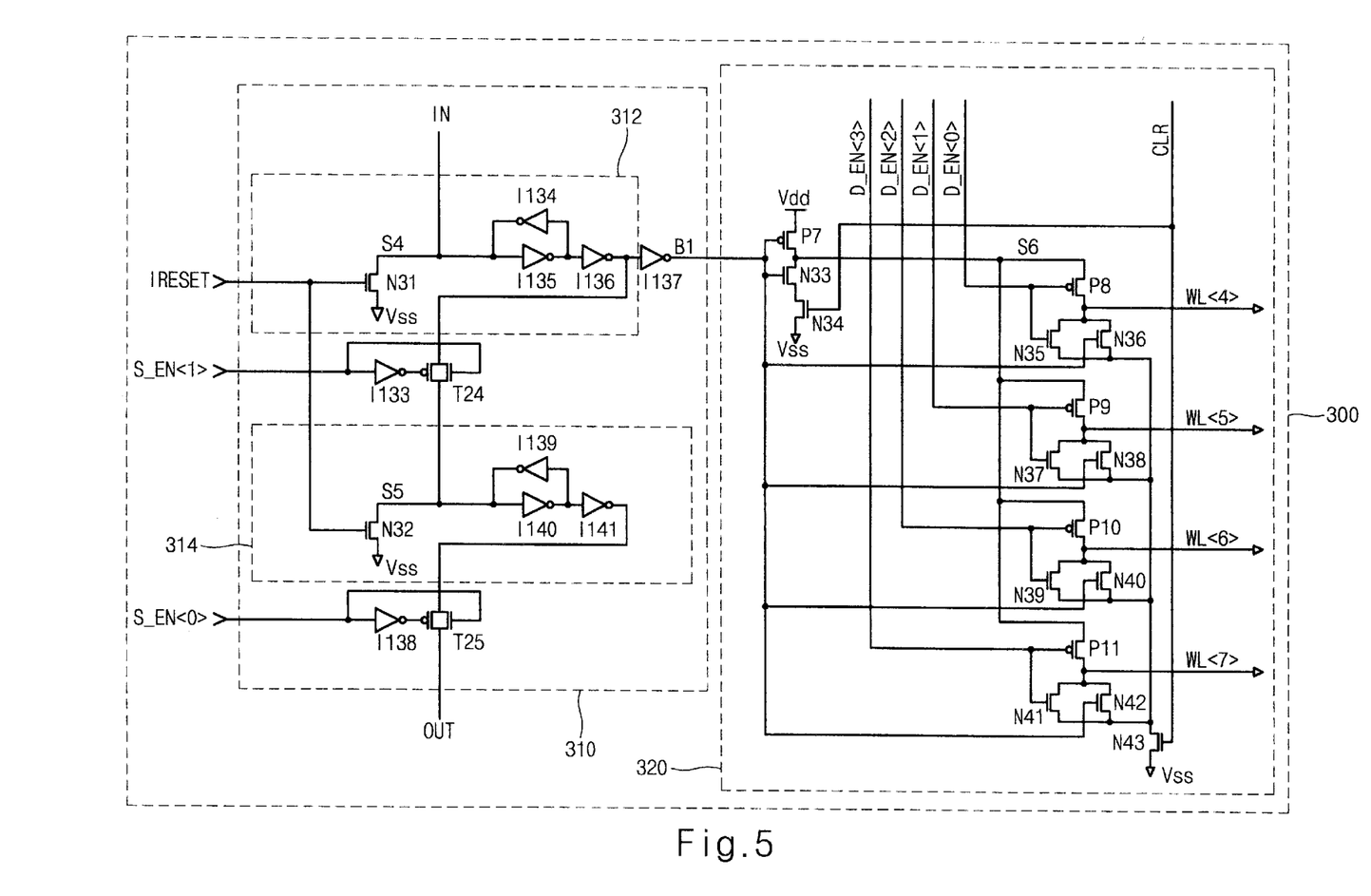
FIG. 5 is a circuit diagram of the intermediate decoder in FIG. 2.

FIG. 5 is a circuit diagram of the intermediate decoder 300. The intermediate decoder 300 includes a shift register 310 and a driver 320.

The shift register 310 stores the output signal of the latch circuit 214 within the first decoder 200 inputted to its input terminal IN for a given period of time in response to the internal reset signal IRESET and the plurality of shift register enable signals S_EN<0:1> and then generates a latch signal B1. The driver 320 receives the latch signal B1 from the shift register 310, the driver enable signal D_EN<0:3> and the clear signal CLR to generate wordline-driving signals WL<4:7>.

In the shift register 310, a latch circuit 312 latches the output signal of the first decoder 200 inputted to its input terminal IN, in response to the internal reset signal IRESET. An inverter I137 inverts the output signal of the latch circuit 312 to generate the latch signal B1. An inverter I133 inverts the shift register enable signal S_EN<1>. A transfer gate T24 transfers the output signal of the latch circuit 312 under the control of the shift register enable signal S_EN<1> and the output signal of the inverter I133. The latch circuit 314 latches the output signal of the latch circuit 312 inputted via the transfer gate T24 314 in response to the internal reset signal IRESET. An inverter I138 inverts the shift register enable signal S_EN<0>. A transfer gate T25 transfers the output signal of the latch circuit 314 to a latch circuit at the next stage in response to the shift register enable signal S_EN<0> and the output signal of the inverter I138.

Since these latch circuits 312 and 314 have the same structure as those of the latch circuits 212 and 214 within the first decoder 200, and the driver 320 has the same structure as that of the driver 220 in FIG. 4, the detailed explanation will be omitted.

Figure 6:
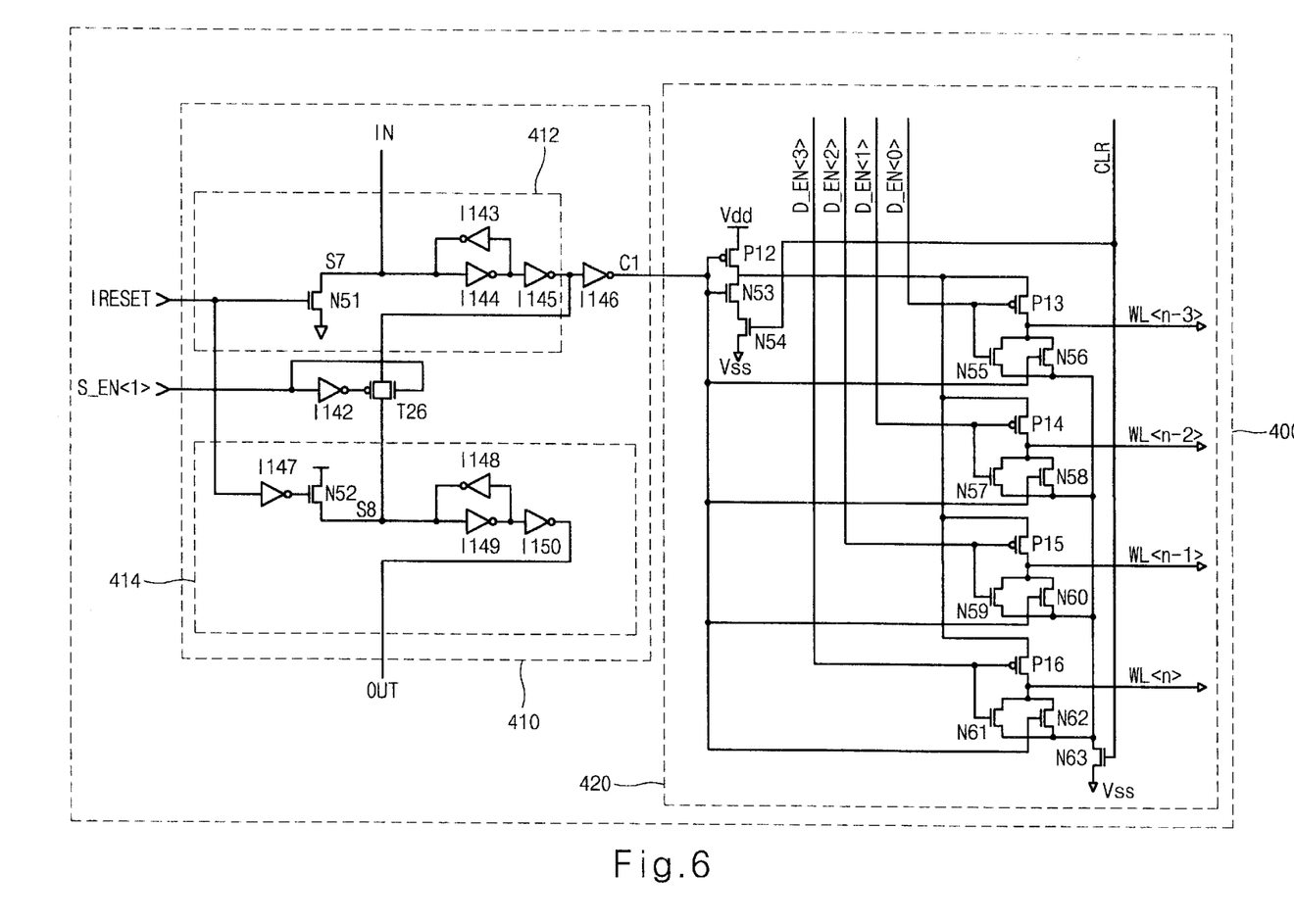
FIG. 6 is a circuit diagram of the $n^{th}$ decoder in FIG. 2.

FIG. 6 is a circuit diagram of the $n^{th}$ decoder 400, which includes a shift register 410 and a driver 420.

The shift register 410 stores the output signal of the latch circuit 314 within the intermediate decoder 300 inputted to its input terminal IN for a given period of time in response to the internal reset signal IRESET and the shift register enable signal S_EN<1> and then generates a latch signal C1. The driver 420 receives the latch signal C1 from the shift register 410, driver enable signals D_EN<0:3> and the clear signal CLR to generate wordline-driving signals WL<n−3:n>.

In the shift register 410, the latch circuit 412 latches the output of the latch signal 314 within the intermediate decoder 300 inputted to its input terminal IN, in response to the internal reset signal IRESET. An inverter I146 inverts the output signal of the latch circuit 412 to generate the latch signal C1. An inverter I142 inverts the shift register enable signal S_EN<1>. A transfer gate T26 transfers the output signal of the latch circuit 412 under the control of the shift register enable signal S_EN<1> and the output signal of the inverter I142. A latch circuit 414 latches the output signal of the latch circuit 412 inputted to the transfer gate T26 in response to the internal reset signal IRESET.

Since these latch circuits 412 and 414 have the same structure as those of the latch circuits 212 and 214 within the first decoder 200, and the driver 320 has the same structure as that of the driver 220 in FIG. 4, the detailed explanation will be omitted.

Next, the operation of the decoder circuit in the semiconductor memory device according to a preferred embodiment of the present invention will be explained.

First, functions of each of the signals will be described. The reset signal RESET is used to initialize all the circuits. The external clock signal CLK drives the shift register to sequentially activate the output signals of the drivers at a rising edge upon toggling. Also, the clear signal CLR functions to clear wordline-driving signals other than the wordline-driving signals which are activated for a time as long as the pulse width of the external clock signal CLK when the external clock signal CLK toggles, and to float the wordline-driving signals during the remaining time period. To remove the floating of the wordline-driving signals, it is required that the clear signal CLR be maintained at HIGH level.

When the external clock signal CLK is at LOW level, if the reset signal RESET is transited to HIGH level, the clear signal CLR and the latch signal D2 go to HIGH level. By such operation, the driver enable signal D_EN<3> and the shift register enable signals S_EN<0:1> are initialized to be at LOW level.

The wordline-driving signals WL<0:n> outputted from the first~$n^{th}$ decoders 200, 300 and 400 are initialized to be at LOW level by a combination of the internal reset signal IRESET with HIGH level and the driver enable signals D_EN<0:3>. A node S8 in the $n^{th}$ decoder 400 is initialized to be at HIGH level by the internal reset signal IRESET with HIGH level. Thereafter, if the internal reset signal IRESET is changed to LOW level which is its original state, all initialization processes are finished.

After these initialization processes, if the external clock signal CLK initially toggles, the shift register enable signal S_EN<0> goes to HIGH level at a rising edge of the external clock signal CLK. A node S1 goes to HIGH level if an initialized signal with HIGH level of the node S8 in the $n^{th}$ decoder 400 is inputted via the transfer gate T21. A node S3 is changed from LOW level to HIGH level. At this time, if the driver enable signal D_EN<0> is changed from HIGH level to LOW level, the first wordline-driving signal WL<0> becomes active to be at HIGH level.

Next, if the external clock signal CLK toggles secondly, the driver enable signal D_EN<0> is changed from LOW level to HIGH level at a rising edge of the external clock signal CLK. Also, the first wordline-driving signal WL<0> is disabled to be at LOW level while a next driver enable signal D_EN<1> is changed from HIGH level to LOW level. Then, the second wordline-driving signal WL<1> becomes active to be at HIGH level. The shift register enable signal S_EN<0> is changed to LOW level so that the transfer gate T21 connected to a line of the shift register enable signal S_EN<0> is disabled.

Then, if the external clock signal CLK toggles thirdly, the driver enable signal D_EN<1> is changed from LOW level to HIGH level. Thus, the second wordline-driving signal WL<1> is disabled to be at LOW level while the driver enable signal D_EN<2> is changed from HIGH level to LOW level. Also, the third wordline-driving signals WL<2> becomes active to be at HIGH level.

When the shift register S_EN<1> is changed from LOW level to HIGH level, the HIGH level in the node S1 is transferred to a node S2 via the transfer gate T22. The LOW level in the node S7 at the previous stage is transferred to the node S8 at HIGH level in the $n^{th}$ decoder 400, and then the node S8 goes to LOW level.

Next, if the external clock signal CLK toggles fourthly, the driver enable signal D_EN<2> is changed from LOW level to HIGH level. Then, the third wordline-driving signal WL<2> is disabled to be at LOW level while a next driver enable signal <D-EN<3> is changed from HIGH level to LOW level. Also, the fourth wordline-driving signal WL<3> becomes active to be at HIGH level.

If the shift register enable signal S_EN<1> is changed from HIGH level to LOW level, all transfer gates connected to a line of the shift register enable signal S_EN<1> are disabled.

Then, if the external clock signal CLK toggles fifthly, the shift register enable signal S_EN<0> goes to HIGH level at a rising edge of the external clock signal CLK. A node S1 is cleared to be at LOW level when the signal cleared to be at LOW level at the node S8 of the $n^{th}$ decoder 400 is inputted via the transfer gate T21. The node S3 is changed from HIGH level to LOW level while the driver enable signal D_EN<3> is changed from LOW level to HIGH level. The fourth wordline-driving signal WL<3> is disabled and goes from HIGH level to LOW level.

If the shift register enable signal S_EN<0> is changed from LOW level to HIGH level, the HIGH level at the node S2 is inputted to a node S4 of the intermediate decoder 300. Then, the node S6 goes to HIGH level. When the driver enable signal D_EN<0> is changed to be at LOW level, the fifth wordline-driving signal WL<4> becomes active to be at HIGH level.

As mentioned above, the wordline-driving signals are sequentially activated by the consecutive toggle of the external clock signal CLK. In other words, if the external clock signal CLK toggles after the wordline-driving signal WL<n> of the $n^{th}$ decoder 400, which is the final stage, is activated, the wordline-driving signal WL<0> of the first decoder 200, which is the first stage, is activated. As a result, the decoder circuit of the present invention forms an infinite loop structure.

Figure 7:
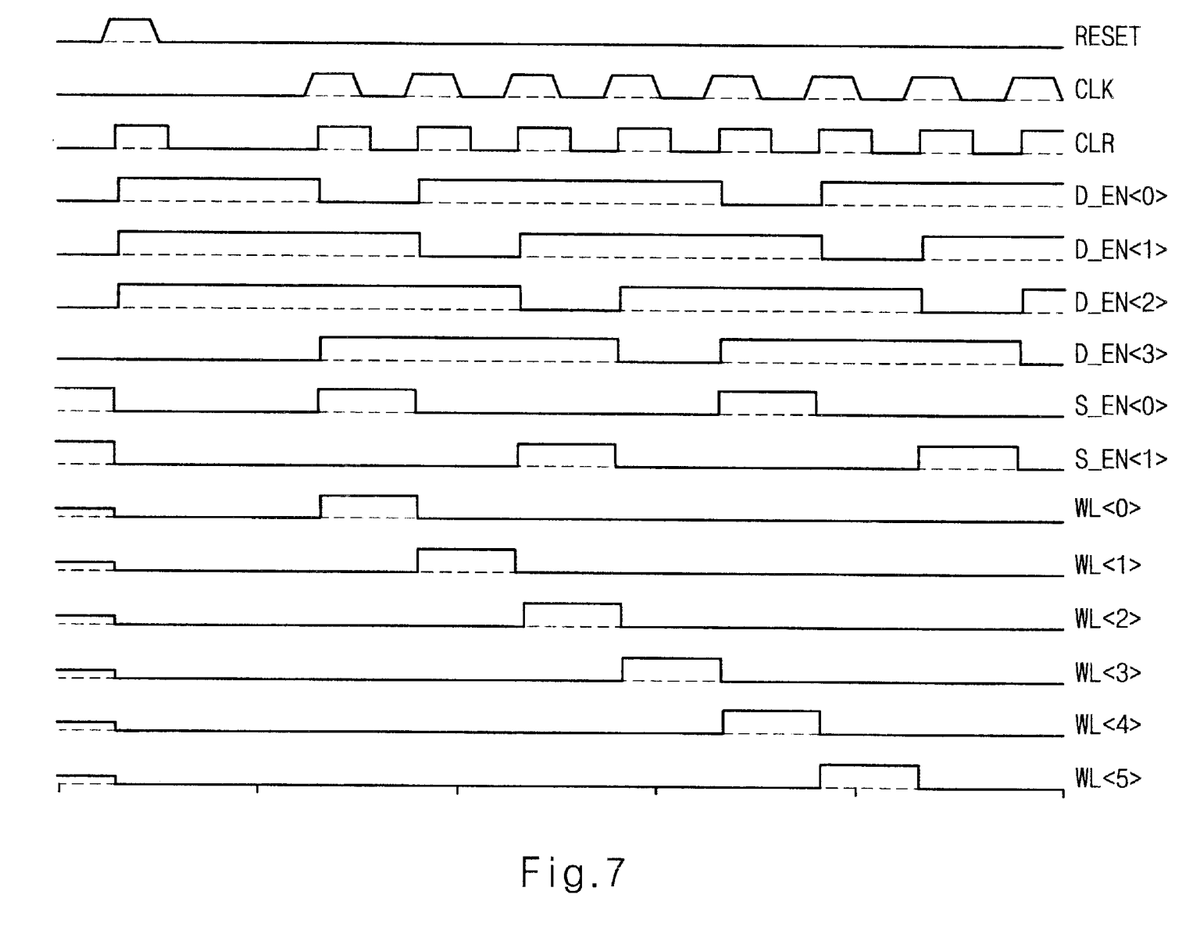
FIG. 7 is a timing chart of major signals of a decoder circuit in a semiconductor memory device according to a preferred embodiment of the present invention.

FIG. 7 is a timing chart of the major signals of a decoder circuit in a semiconductor memory device according to a preferred embodiment of the present invention.

Referring now to FIG. 7, an infinite loop structure is formed in which the wordline-driving signals WL<0:5> are sequentially activated by the consecutive toggling of the external clock signal CLK.

As mentioned above, the present invention positions one latch circuit for maintaining a wordline-driving signal for a given period of time and one latch circuit for transferring a signal to a shift register at the next stage at four drivers and controls the four drivers using four driver enable signals. Therefore, the present invention can reduce the area occupied by a shift register circuit compared to a decoder in which two latch circuits are positioned at each driver.

Further, the present invention can reduce the die size by using a decoder that occupies a small area.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A decoder circuit in a semiconductor memory device, the decoder circuit comprising:

a decoder control means for outputting a plurality of control signals in response to an external clock signal and a reset signal; and a plurality of decoders each of which drives a plurality of word lines in response to the plurality of control signals, an output node of one decoder being connected to an input node of an adjacent decoder and an output node of a last decoder being connected to an input node of a first decoder.

2. The decoder circuit in a semiconductor memory device according to claim 1, wherein the decoder control means comprises:

a clear signal generator for receiving the external clock signal and an inverted signal of the reset signal to generate first and second internal clock signals and a clear signal;

an internal reset signal generator for receiving the reset signal to generate an internal reset signal;

an assembled latch circuit for generating a plurality of latch signals in response to the first and the second internal clock signals and the internal reset signal; and a shift register/driver enable signal generator for receiving the plurality of latch signals to generate a plurality of driver enable signals and a plurality of shift register enable signals.

3. The decoder circuit in a semiconductor memory device according to claim 2, wherein the clear signal generator comprises:

a first logic device for logically combining the external clock signals and the inverted signal of the reset signal;

first and second inverting devices for inverting an output signal of the first logic device to generate the first internal clock signal;

a third inverting device for inverting the first internal clock signal to generate the second internal clock signal;

a second logic device for logically combining an inverted signal of the internal reset signal and the first internal clock signal; and a plurality of inverting devices for inverting an output signal of the second logic device to generate the clear signal.

4. The decoder circuit in a semiconductor memory device according to claim 2, wherein the internal reset signal generator includes a plurality of inverting devices for sequentially inverting the reset signal to generate the internal reset signal.

5. The decoder circuit in a semiconductor memory device according to claim 2, wherein the assembled latch circuit has a loop structure in which an output signal of the latch circuit at the last stage of the plurality of latch circuits is inputted to the latch circuit at the first stage of the plurality of latch circuits.

6. The decoder circuit in a semiconductor memory device according to claim 5, wherein the assembled latch circuit includes a plurality of latch circuits for generating a plurality of latch signals in response to the first and the second internal clock signals and the internal reset signal.

7. The decoder circuit in a semiconductor memory device according to claim 2, wherein the shift register/driver enable signal generator comprises:
a plurality of driver enable signal generators for receiving the plurality of latch signals to generate the plurality of driver enable signals; and
a plurality of register enable signal generators for receiving some of the plurality of latch signals to generate the plurality of shift register enable signals.

8. The decoder circuit in a semiconductor memory device according to claim 2, wherein a decoder of the plurality of decoders comprises:
a shift register for generating a latch signal in response to the internal reset signal and the plurality of shift register enable signals, wherein the shift register is connected between the input node and the output node of the decoder; and
a plurality of drivers for receiving the latch signal, the plurality of driver enable signals and the clear signal to generate a plurality of word line-driving signals.

9. The decoder circuit in a semiconductor memory device according to claim 8, wherein the shift register in the first decoder comprises:
a first transfer unit for transferring an output signal from the output node of the last decoder of the plurality of the decoders in response to one of the plurality of shift register enable signals;
a first latch for latching a signal transferred from the first transfer unit in response to the internal reset signal;
a second transfer unit for transferring a signal latched by the first latch in response to another of the plurality of shift register enable signals;
a second latch for latching a signal transferred from the second transfer unit in response to the internal reset signal; and
a third transfer unit for transferring a signal latched by the second latch in response to the one of the plurality of shift register enable signals, wherein the latch signal is provided at the first latch.

10. The decoder circuit in a semiconductor memory device according to claim 8, wherein each of the plurality of drivers comprises:
a driving unit for receiving one of the plurality of latch signals and the clear signal to generate a driver-driving signal; and
a designated number of wordline-driving signal generators for receiving the driver-driving signal, the plurality of driver enable signals and the clear signal to generate some of the plurality of wordline-driving signals.

11. A decoder circuit in a semiconductor memory device, the decoder circuit comprising:
a decoder control means for generating an internal reset signal, a plurality of driver enable signals and a plurality of shift register enable signals in response to an external clock signal and a reset signal;
a plurality of shift registers for generating a plurality of latch signals in response to the internal reset signal and the plurality of shift register enable signals; and
a plurality of drivers for driving a plurality of wordlines in response to the plurality of latch signals and the plurality of driver enable signals,
wherein the plurality of shift registers has a loop structure in which an output signal of the shift register at the last stage of the plurality of shift registers is inputted to an input terminal of the shift register at the first stage of the plurality of shift registers.

12. The decoder circuit in a semiconductor memory device according to claim 11, wherein the decoder control means comprises:
a clear signal generator for receiving the external clock signal and an inverted signal of the reset signal to generate first and second internal clock signals and a clear signal;
an internal reset signal generator for receiving the reset signal to generate the internal reset signal;
an assembled latch circuit for generating a plurality of latch signals in response to the first and the second internal clock signals and the internal reset signal; and
a shift register/driver enable signal generator for receiving the plurality of latch signals to generate the plurality of driver enable signals and the plurality of shift register enable signals.

13. The decoder circuit in a semiconductor memory device according to claim 12, wherein the clear signal generator comprises:
a first logic device for logically combining the external clock signal and the inverted signal of the reset signal;
first and second inverting means for inverting an output signal of the first logic device to generate the first internal clock signal;
a third inverting device for inverting the first internal clock signal to generate the second internal clock signal;
a second logic device for logically combining the inverted signal of the internal reset signal and the first internal clock signal; and
a plurality of inverting means for inverting an output signal of the second logic device to generate the clear signal.

14. The decoder circuit in a semiconductor memory device according to claim 12, wherein the internal reset signal generator includes a plurality of inverting devices for sequentially inverting the reset signal to generate the internal reset signal.

15. The decoder circuit in a semiconductor memory device according to claim 12, wherein the assembled latch circuit has a loop structure in which an output signal of the latch circuit at the last stage of the plurality of latch circuits is inputted to the latch circuit at the first stage of the plurality of latch circuits.

16. The decoder circuit in a semiconductor memory device according to claim 15, wherein the assembled latch circuit includes a plurality of latch circuits for generating the plurality of latch signals in response to the first and the second internal clock signals and the internal reset signal.

17. The decoder circuit in a semiconductor memory device according to claim 12, wherein the shift register/driver enable signal generator comprises:
- a plurality of driver enable signal generators for receiving the plurality of latch signals to generate the plurality of driver enable signals; and
- a plurality of register enable signal generators for receiving some of the plurality of latch signals to generate the plurality of shift register enable signals.

18. The decoder circuit in a semiconductor memory device according to claim 11, wherein the plurality of shift registers comprise a plurality of following components arranged sequentially and repeatedly a predetermined number of times:
- a first transfer unit for transferring the output signal from the shift register at the last stage in response to one of the plurality of shift register enable signals;
- a first latch circuit for latching an output signal from the first transfer unit in response to the internal reset signal;
- a second transfer unit for transferring the output signal of the first latch circuit in response to another of the plurality of shift register enable signals; and
- a second latch circuit for latching an output signal from the second transfer unit in response to the internal reset signal.

19. The decoder circuit in a semiconductor memory device according to claim 11, wherein each of the plurality of drivers comprises:
- a driving unit for receiving one of the plurality of latch signals and the clear signal to generate a driver-driving signal; and
- a designated number of wordline-driving signal generators for receiving the driver-driving signal, the plurality of driver enable signals and the clear signal to generate some of the plurality of wordline-driving signals.

20. The decoder circuit in a semiconductor memory device according to claim 8, wherein the shift register in the last decoder comprises:
- a first latch for latching a signal from the input node of the last decoder in response to the internal reset signal;
- a transfer unit for transferring a signal latched by the first latch in response to one of the plurality of shift register enable signals; and
- a second latch for latching a signal transferred from the transfer unit in response to the internal reset signal, wherein the latch signal is provided at the first latch.

21. The decoder circuit in a semiconductor memory device according to claim 8, wherein the shift register in a decoder between the first decoder and the last decoder comprises:
- a first latch for latching a signal from the input node of the decoder in response to the internal reset signal;
- a first transfer unit for transferring a signal latched by the first latch in response to one of the plurality of shift register enable signals;
- a second latch for latching a signal transferred from the first transfer unit in response to the internal reset signal; and
- a second transfer unit for transferring a signal latched by the second latch in response to another of the plurality of shift register enable signals, wherein the latch signal is provided at the first latch.

22. A decoder circuit in a semiconductor memory device comprising:
- a plurality of decoders;
- a decoder control means for controlling the plurality of decoders in response to an external clock signal and a reset signal, said plurality of decoders driving a plurality of word lines in response to output signals from said decoder control means;
- said decoder control means including,
  - a clear signal generator for receiving the external clock signal and an inverted signal of the reset signal to generate first and second internal clock signals and a clear signal;
  - an internal reset signal generator for receiving the reset signal to generate an internal reset signal;
  - an assembled latch circuit for generating a plurality of latch signals in response to the first and the second internal clock signals and the internal reset signal; and
  - a shift register/driver enable signal generator for receiving the plurality of latch signals to generate a plurality of driver enable signals and a plurality of shift register enable signals.

* * * * *